United States Patent [19]
Smith, II

[11] Patent Number: 4,980,661
[45] Date of Patent: Dec. 25, 1990

[54] DIPLEXER FOR COUPLING RF SIGNALS, AS WELL AS A DC SAWTOOTH SIGNAL, TO AN ANTENNA

[75] Inventor: Frank P. Smith, II, Dresher, Pa.

[73] Assignee: Litton Systems, Inc., Springfield, Pa.

[21] Appl. No.: 332,209

[22] Filed: Mar. 31, 1989

[51] Int. Cl.⁵ .............................................. H03H 7/46
[52] U.S. Cl. .................................... 333/132; 343/858; 370/37; 370/38
[58] Field of Search ............... 333/126, 129, 132, 134; 343/709, 858; 455/95, 98, 99; 342/385, 386, 419, 457, 464, 465, 357; 370/37, 38

[56] References Cited

U.S. PATENT DOCUMENTS

| | | | |
|---|---|---|---|
| 2,076,248 | 4/1937 | Norton | 333/126 X |
| 2,768,351 | 10/1956 | Scholten et al. | 333/129 |
| 4,101,894 | 7/1978 | Warner et al. | 343/709 X |

FOREIGN PATENT DOCUMENTS

| | | | |
|---|---|---|---|
| 24026 | 2/1977 | Japan | 333/132 |
| 1330838 | 11/1973 | United Kingdom | 333/132 |

Primary Examiner—Benny T. Lee
Attorney, Agent, or Firm—Brian L. Ribando

[57] ABSTRACT

A diplexer couples a plurality of RF signals and a strobe signal to the antenna of an emergency transmitter buoy. A plurality of filters in the diplexer each pass a preselected signal to the antenna and block other signals from being reflected into the signal sources.

6 Claims, 1 Drawing Sheet

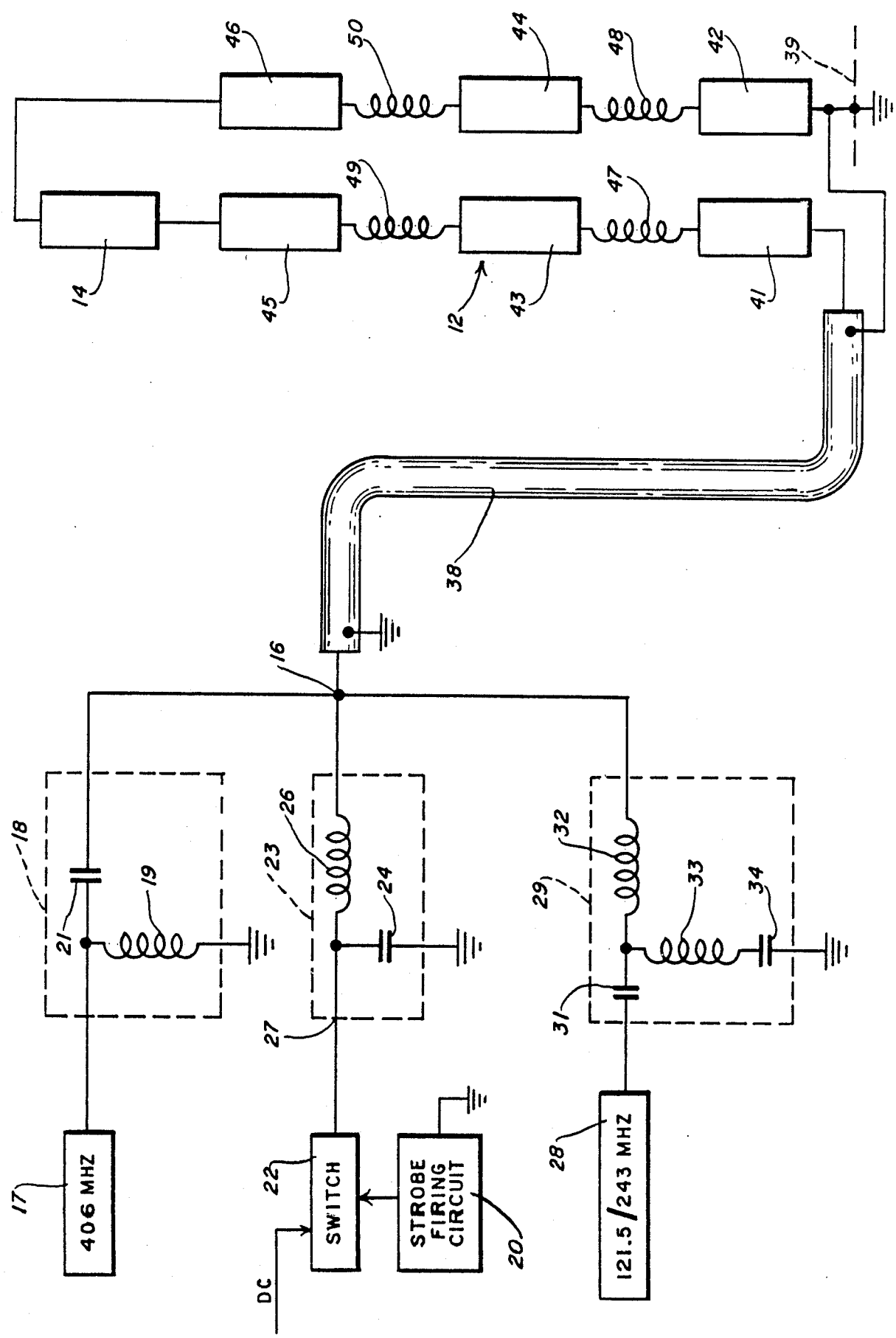

DIPLEXER FOR COUPLING RF SIGNALS, AS WELL AS A DC SAWTOOTH SIGNAL, TO AN ANTENNA

The invention relates to a diplexer which couples a plurality of RF signals and a strobe signal to an antenna.

BACKGROUND OF THE INVENTION

Devices for coupling an RF signal to an antenna are well known in the art. However, in certain applications it may be necessary to couple a plurality of RF signals to an antenna, such as for example in the environment of an emergency transmitter buoy in which a satellite signal and one or two search and rescue homing signals are radiated by a single antenna. If the antenna is part of a transmitter buoy, it may also be desirable to mount a strobe lamp on the top of the antenna to aid in location of the buoy during a search and rescue operation. The strobe lamp requires a strobe signal, and the strobe signal must also be coupled to the antenna together with the satellite and the search and rescue signals.

SUMMARY AND OBJECTS OF THE INVENTION

A diplexer is used to couple a plurality of RF signals and a strobe signal to a multifrequency antenna. The diplexer comprises a plurality of filters for passing selected frequency signals to the antenna and for blocking other frequencies being fed to the antenna from other parts of the transmitter circuitry. A strobe lamp on the antenna is fed the strobe signal which is coupled to the antenna by the diplexer.

It is accordingly an object of the invention to provide a diplexer for coupling a plurality of RF signals to an antenna.

It is another object of the invention to provide a diplexer for feeding a strobe signal to an antenna which is also fed a plurality of RF signals.

These and other objects of the invention will be apparent from the following detailed description in which reference numerals used throughout the description correspond to reference numerals shown on the drawing figures.

BRIEF DESCRIPTION OF THE DRAWINGS

The sole drawing figure shows a diplexer according to the invention.

DESCRIPTION OF THE PREFERRED EMBODIMENT

The drawing figure shows an antenna 12 which is used to radiate a plurality of RF signals and which includes a strobe 14 mounted on the peak thereof. The antenna 12 is coupled to a terminal point 16 through a transmission line 38 which receives RF signals and strobe signals as more fully explained below.

A 406 MHZ RF source 17 is coupled to a first bandpass filter 18 which is tuned to 406 MHZ. The first filter 18 is an L filter comprising an inductor 19 coupled to ground and a capacitor 21 coupled to the terminal point 16. A strobe firing circuit 20 and a switch 22 are coupled to the input 27 of a low pass filter 23. The low pass filter 23 comprises a capacitor 24 coupled to ground and an inductor 26 coupled to the terminal point 16, and signals from the circuit elements 22 and 20 charge and fire the strobe 14.

A 121.5 MHZ and 243 MHZ source 28 is coupled to a second bandpass filter 29 which is tuned to a frequency which will best accommodate the two RF signals from the source 28. The filter 29 is a T filter comprising a capacitor 31 and an inductor 32 in the arms of the T which are coupled to the terminal point 16 and an inductor 33 and a capacitor 34 coupled to ground.

The terminal point 16 is coupled by a transmission line 38 to the multifrequency antenna 12 and to a ground plane 39. The antenna 12 includes a plurality of transmission sections 41–46 coupled together by inductors 47–50. The section 41–46 are dimensioned for optimal transmission of the 121.5 MHZ, 243 MHZ, and 406 MHZ signals and are isolated from one another at the transmission frequencies by the inductors 47–50.

The strobe 14 is mounted on the antenna 12 and is connected between antenna segments 45 and 46.

In use, the 406 MHZ source 17 is a 5-watt transmitter which transmits a 406 MHZ signal over the antenna 12 which is intended to be received by a satellite which is a part of the search and rescue satellite network. The 121.5 MHZ and 243 MHZ source 28 is a transmitter which transmits homing signals over the antenna 12 to search and rescue vehicles at a power level of 100 milliwatts or less. The inductor 33 and capacitor 34 in the filter 29 provide an RF trap for the 406 MHZ signal so that the signal from the transmitter 17 will not be reflected into the transmitter 28. The capacitor 31 in the filter 29 protects the transmitter 28 from the DC sawtooth signal; and in a similar fashion, the capacitor 21 in the filter 18 protects the transmitter 17 from the DC sawtooth signal. The capacitor 34 in the filter 29 prevents the sawtooth signal from being coupled to ground through the inductors 32 and 33.

The strobe 14 facilitates the visual detection of the transmitter buoy in the open sea.

Having thus described the invention, various alterations and modifications thereof will occur to those skilled in the art, which alterations and modifications are intended to be within the scope of the invention as defined by the appended claims.

What is claimed is:

1. A circuit for selectively coupling a high power RF signal source, a low power RF signal source, and a DC sawtooth signal source to an antenna comprising:
    a first bandpass filter, having an input and an output, which couples the high power RF signal source to the antenna;
    a second bandpass filter, having an input and an output, which couples the low power RF signal source to the antenna; and
    a low pass filter, having an input and an output, which couples the DC sawtooth signal source to the antenna.

2. The circuit of claim 1 wherein the first bandpass filter comprises:
    a first DC blocking capacitor coupled between the input and the output of the first filter to block the DC sawtooth signal from the high power RF signal source and from ground.

3. The circuit of claim 2 wherein the second bandpass filter comprises:
    a trap for signals from the high power RF signal source to protect the low power RF signal source including a first inductor series connected to a second DC blocking capacitor and coupled between the input and the output of the second filter, and a second inductor and capacitor series connected between the first inductor and ground; and said second DC blocking capacitor protects the low power RF signal source from the DC sawtooth signal source.

4. The circuit of claim 3 wherein the first bandpass filter further comprises an inductor coupled between ground and the first DC blocking capacitor.

5. The circuit of claim 4 wherein the low pass filter comprises an inductor coupled between the input and the output of the low pass filter and a capacitor coupled between the inductor and ground.

6. The circuit of claim 5 wherein the output of each filter is coupled to the antenna at a common node.

* * * * *